(12) United States Patent
Nakasuka et al.

(10) Patent No.: US 8,028,745 B2
(45) Date of Patent: Oct. 4, 2011

(54) HEAT TRANSFER APPARATUS OF A FORCED CONVECTION TYPE

(75) Inventors: Shinichi Nakasuka, Bunkyo-ku (JP); Hironori Sahara, Bunkyo-ku (JP); Kenji Higashi, Yamatotakada (JP)

(73) Assignees: Da Vinci Co., Ltd., Nara (JP); The University of Tokyo, Tokyo (JP)

( * ) Notice: Subject to any disclaimer, the term of this patent is extended or adjusted under 35 U.S.C. 154(b) by 1157 days.

(21) Appl. No.: 11/720,725

(22) PCT Filed: Nov. 30, 2005

(86) PCT No.: PCT/JP2005/021957
§ 371 (c)(1),
(2), (4) Date: Jun. 1, 2007

(87) PCT Pub. No.: WO2006/059623
PCT Pub. Date: Jun. 8, 2006

(65) Prior Publication Data
US 2008/0277100 A1 Nov. 13, 2008

(30) Foreign Application Priority Data

Dec. 3, 2004 (JP) .................................. 2004-350762

(51) Int. Cl.
*F28D 15/00* (2006.01)
(52) U.S. Cl. ................................................. 165/104.28
(58) Field of Classification Search ............. 165/104.28
See application file for complete search history.

(56) References Cited

U.S. PATENT DOCUMENTS

| 4,519,447 A * | 5/1985 | Wiech, Jr. ............... 165/104.28 |
| 6,648,064 B1 * | 11/2003 | Hanson ........................ 165/80.4 |

FOREIGN PATENT DOCUMENTS

| JP | 3078605 U | 8/1991 |
| JP | 3-229493 A | 10/1991 |
| JP | 2004-254437 A | 9/2004 |

\* cited by examiner

*Primary Examiner* — Leonard Leo
(74) *Attorney, Agent, or Firm* — Millen, White, Zelano & Branigan, P.C.

(57) ABSTRACT

A forced convection heat transfer apparatus wherein a large quantity of heat can be efficiently transferred even when a temperature difference is small, by transmitting power to a magnet, which is rotatable along a circulation flow path of a magnetic fluid, and obtaining a magnetic fluid circulation speed in proportion to the rotating speed.

5 Claims, 4 Drawing Sheets

HEAT TRANSFER APPARATUS OF A FORCED CONVECTION TYPE

TECHNICAL FIELD

The present invention relates to a magnetic element for heat transfer. Specifically it relates to a heat transfer apparatus comprising a fluid flow path through which a magnetic fluid is circulated and a rotatable magnet unit for circulating the magnetic fluid by applying a varying magnetic fluid. A large quantity of heat can be transferred based on forced convection by the apparatus even when the temperature differential is small between the heat receiving and discharging sections by rotating the magnet unit along and beside the fluid flow path to obtain a circulating velocity of the magnetic fluid proportionally to the rotational speed of the magnet unit.

BACKGROUND ART

It is well known to transfer a large quantity of heat by circulating fluid through a closed loop using a pump. JP 2003/232596, for example, discloses a heat transfer system of a forced convection type by circulating a magnetic fluid in a magnetic field. This system does not require electrical power and allows to construct in a simple structure without occupying a large space.

Developments in the technology concerning the synthesis and micronization of metal oxide-ferromagnetic materials in recent years have remarkably improved the efficiency of convectional heat transfer by the magnetic fluid.

However, the heat transfer efficiency based on the spontaneous convection has a certain limit no matter how the performance of magnetic fluid is improved. Accordingly, it is difficult to develop a magnetic element capable of transferring a large quantity of heat.

Since the efficiency of heat transfer by the convention decreases as the temperature differential decreases, a temperature differential of at least 10° C. is generally required in the working environment to transfer the heat by the spontaneous convection.

DISCLOSURE OF THE INVENTION

The object of the present invention is to provide a heat transfer apparatus utilizing forced convection which can transfer a large quantity of heat efficiently even when the heat differential is small.

In order to achieve the foregoing object, the apparatus comprises a fluid flow path through which a magnetic fluid is circulated and a rotatable magnet unit disposed along and beside the fluid flow path for magnetically driving a magnetic fluid at a flow rate proportional to the rotational speed of the magnet. Because of forced convection, a large quantity of heat can be transferred even when the heat differential is small.

In the apparatus of the present invention, the magnetic fluid is driven to circulate through the fluid flow path under the influence of rotating magnetic field created by the rotation of the magnet unit in such a way that a large quantity of heat may be transferred even when the temperature differential is small.

BEST MODE FOR CARRYING OUT OF THE INVENTION

The rotatable magnet unit disposed alongside the fluid flow path located in the heat discharge section. The magnet unit preferably has a rod shape and is rotationally driven about an axis by an electrical motor coaxially connected thereto. Thus the magnetic field in the rotational area of the magnet unit varies in strength with the angle of rotation of the magnet unit.

A portion of the fluid flow path to be disposed in the rotational area of the magnet is semi-circular in shape and circumferentially extends through at least 180 degree about the rotational axis. Thus the magnetic fluid is circulated through the fluid flow path in the rotational direction of the magnet unit to transfer the heat.

In another embodiment a rotating fan is co-axially connected to the magnet unit and rotated therewith by an electrical motor. The heat transfer efficiency of the circulating magnetic fluid may be further enhanced by blowing air by the fan to the heat discharge portion of the fluid flow path.

Now the first embodiment of the heat transfer apparatus according to the present invention will be described in further detail with reference to FIG. 1.

Figure 1:
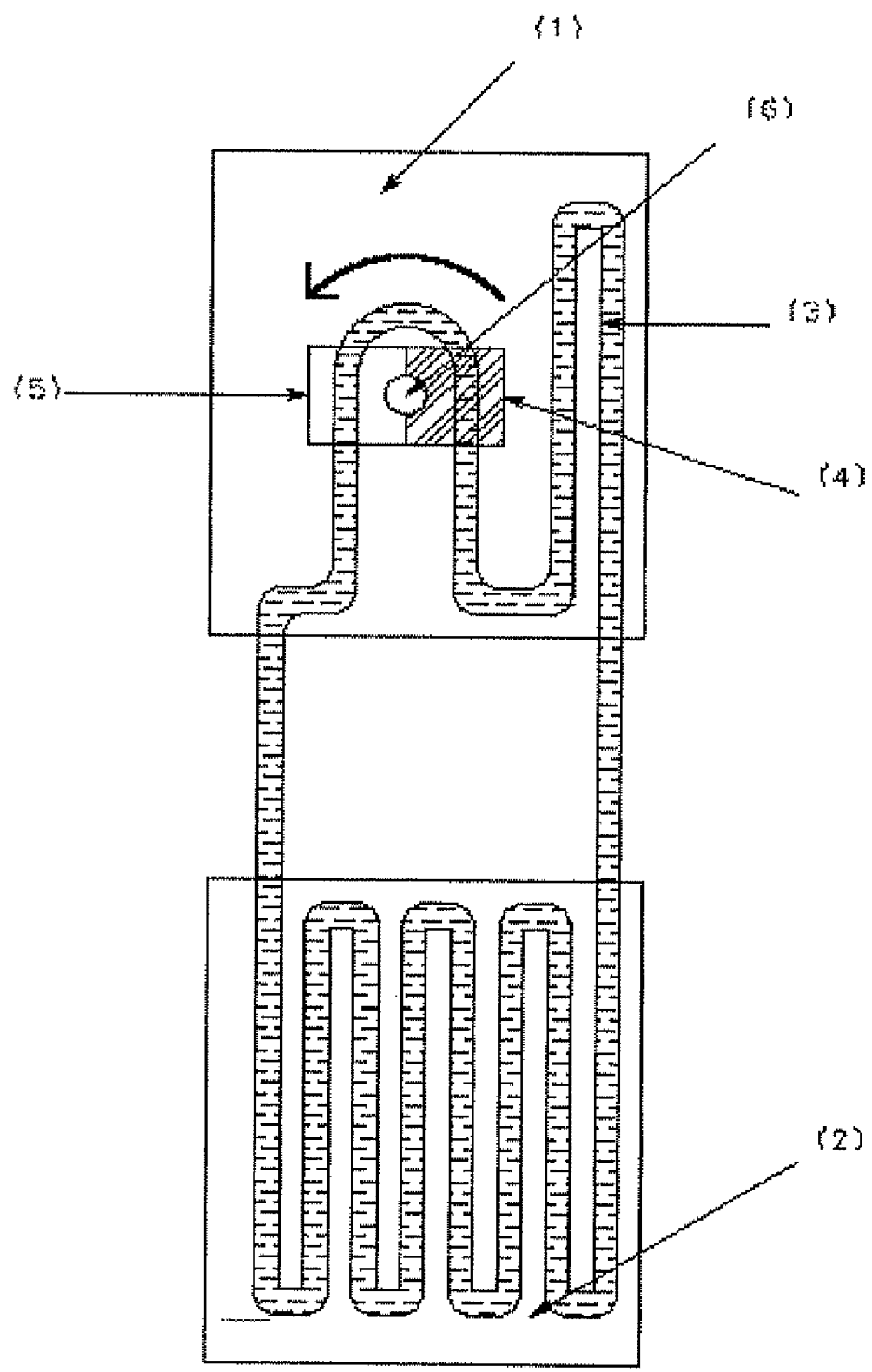
FIG. 1 is a schematic plan view of the first embodiment of the heat transfer apparatus according to the present invention.

The heat transfer apparatus shown in FIG. 1 comprises a heat discharger section (1) a heat receiver section (2), a fluid flow path (3) for circulating a magnetic fluid between the heat discharger section (1) and the heat receiver section (2), a pair of rod-shaped magnets (4, 5) rotatably disposed alongside the fluid flow path (3), and a rotational shaft (6) to which the magnet pair is rotatably connected at the center thereof.

In the embodiment shown in FIG. 1, the magnet pair is rotated by pneumatic, hydraulic or electric power to circulate the magnetic fluid counterclockwise under the influence of a varying magnetic field through the fluid flow path (3) so that a quantity of heat is transferred from the heat receiving section (2) to the heat discharging section (1), for example, for melting snow or generating electric power. The rotatable magnet unit in this embodiment is shown to be in a rod shape but it will be appreciated that other configurations may be employed as well provided that a sufficient gradient is created in the magnetic field.

The magnetic fluid used in this embodiment refers to a dispersion of a magnet powder consisting of a divalent transition metal element and iron oxide having an average particle size less than 30 μm, preferably 1-10 μm in a fluid medium. The magnet particles have been treated with a surfactant to exert a repulsive force to each other when dispersed in a fluid medium such as a paramagnetic gas or liquid.

The heat discharging section (1) is preferably constructed from a magnetism-permeable material such as aluminum. A ferromagnetic metal such as iron is not suitable due to possible magnetization which may inferer with the rotation of the magnet unit. It also preferable to connect between the heat discharging section and the heat receiving section (2) with the fluid flow path (3) made of a flexible plastic tube. However, the connection portions of the fluid flow path may be constructed from a metal tube taking its durability into consideration.

According to this embodiment, heat transfer may be accomplished with a relatively simple structure between the above and beneath the ground either for warming the room during the winter or for cooling the room during the summer. It find use also in the heat equalization between panels of an artificial satellite or similar heat transfer systems requiring a very small amount of rotating power.

Figure 2:
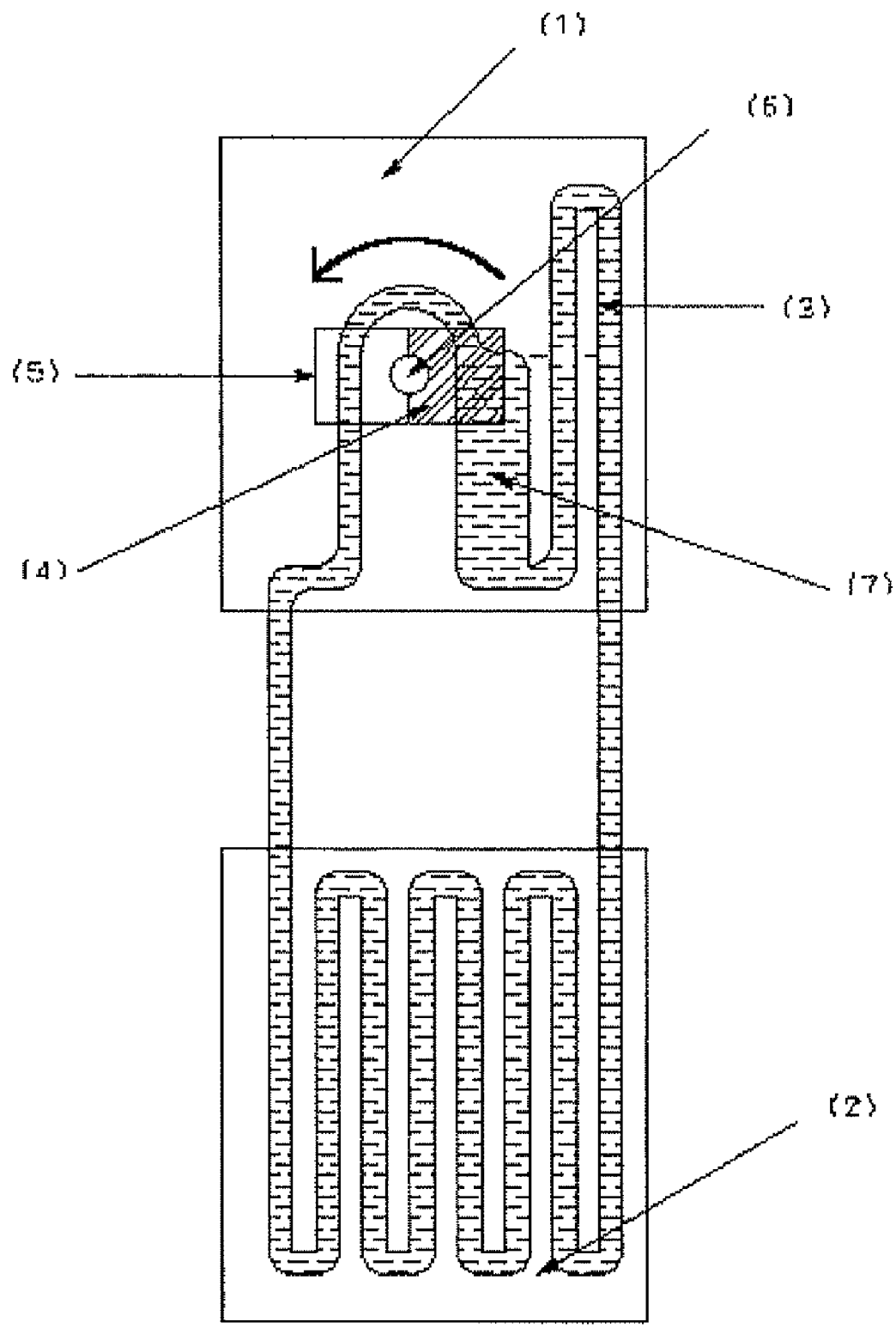
FIG. 2 is a schematic plan view of the second embodiment of the heat transfer apparatus according to the present invention.

Now the second embodiment of the heat transfer apparatus according to the present invention will be described in greater detail with reference to FIG. 2. The embodiment shown in FIG. 2 differs from the embodiment shown in FIG. 1 in that the flow path (3) of the magnetic fluid has an enlarged fluid flow portion (7) in the magnetic field of the rotatable magnet unit. The enlarged fluid flow portion (7) is positioned in the magnetic field of the rotating magnet unit (4, 5) on the upstream side (right hand side in the drawing) of the flow of magnetic fluid so that a large volume of the magnetic fluid is retained in the enlarged fluid flow portion (7).

In addition, the length of the fluid flow path (3) in the heat discharging section (1) is greater on the upstream side (right hand side in the drawing) of the rotating magnet element (4, 5) than on the downstream side (left hand side in the drawing) of the rotating magnet unit (4, 5). As a result, the magnetic fluid is cooled before reaching the enlarged fluid flow portion (7) and exposed to the line of magnetic force there with increased magnetization. Thus, the magnetic fluid is magnetically conveyed counterclockwise by the rotating magnet unit to transfer heat in an efficient manner.

Figure 3:
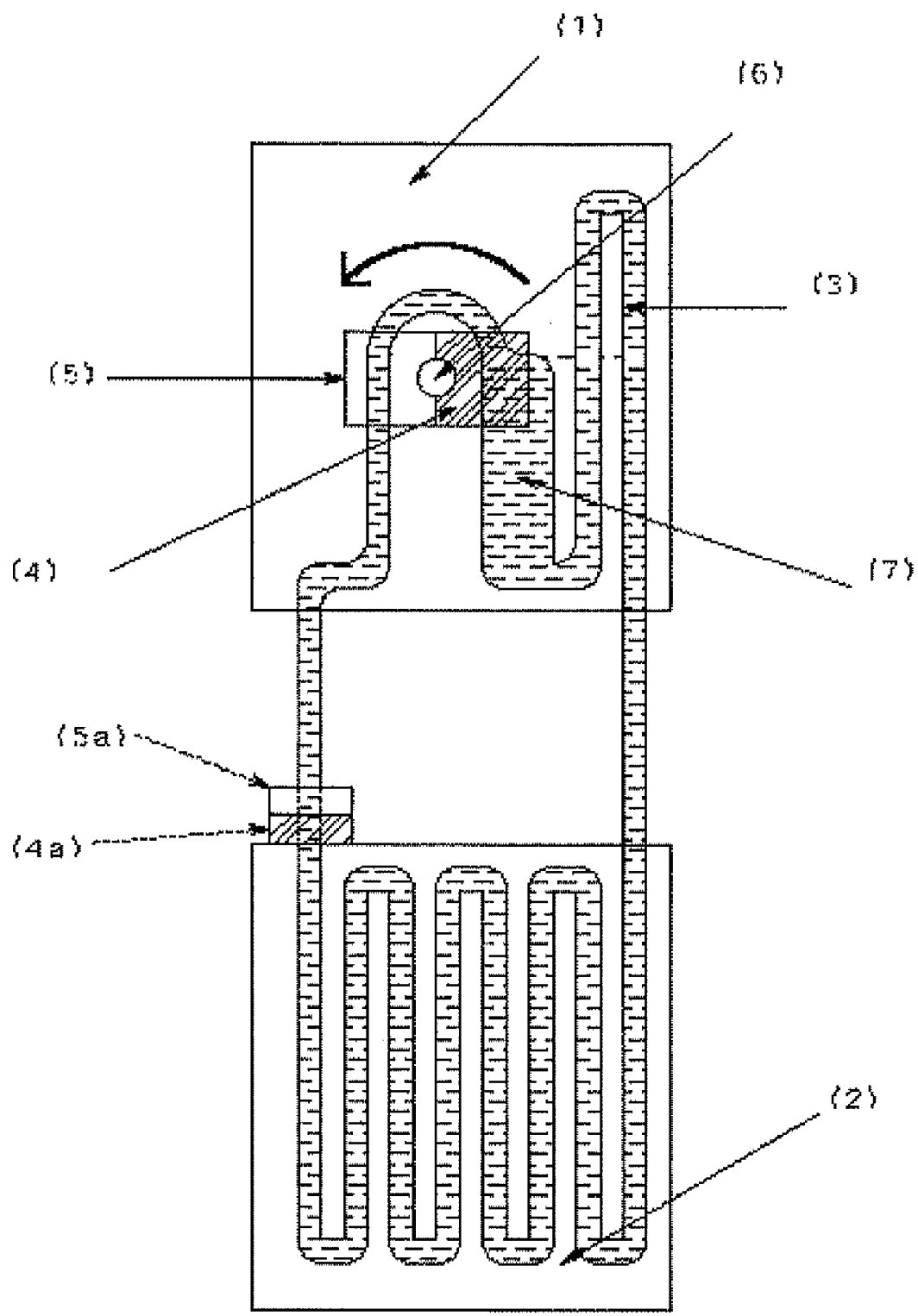
FIG. 3 is a schematic plan view of the third embodiment of the heat transfer apparatus according to the present invention.

Referring to FIG. 3, the third embodiment of the apparatus of the present invention is shown. The apparatus of this embodiment differs from the apparatus shown in FIG. 2 in that the fluid flow path (3) is detachable at the inlet to the heat receiving section (2) by providing respective connecting ends of the flow path (3) with magnetic connector members (4a, 5a) having opposed polarity. Since the temperature of the magnetic fluid in the heat receiving section (2) is higher than the temperature of magnetic fluid in the fluid flow path upstream of the magnetic connector (5a), magnetic convection will be generated in the same direction as the circulating magnetic fluid to assist fluid flow through the flow path (3). Detachable connection of the fluid flow circuit (3) also allows easy infusion and withdrawal of the magnetic fluid.

Figure 4:
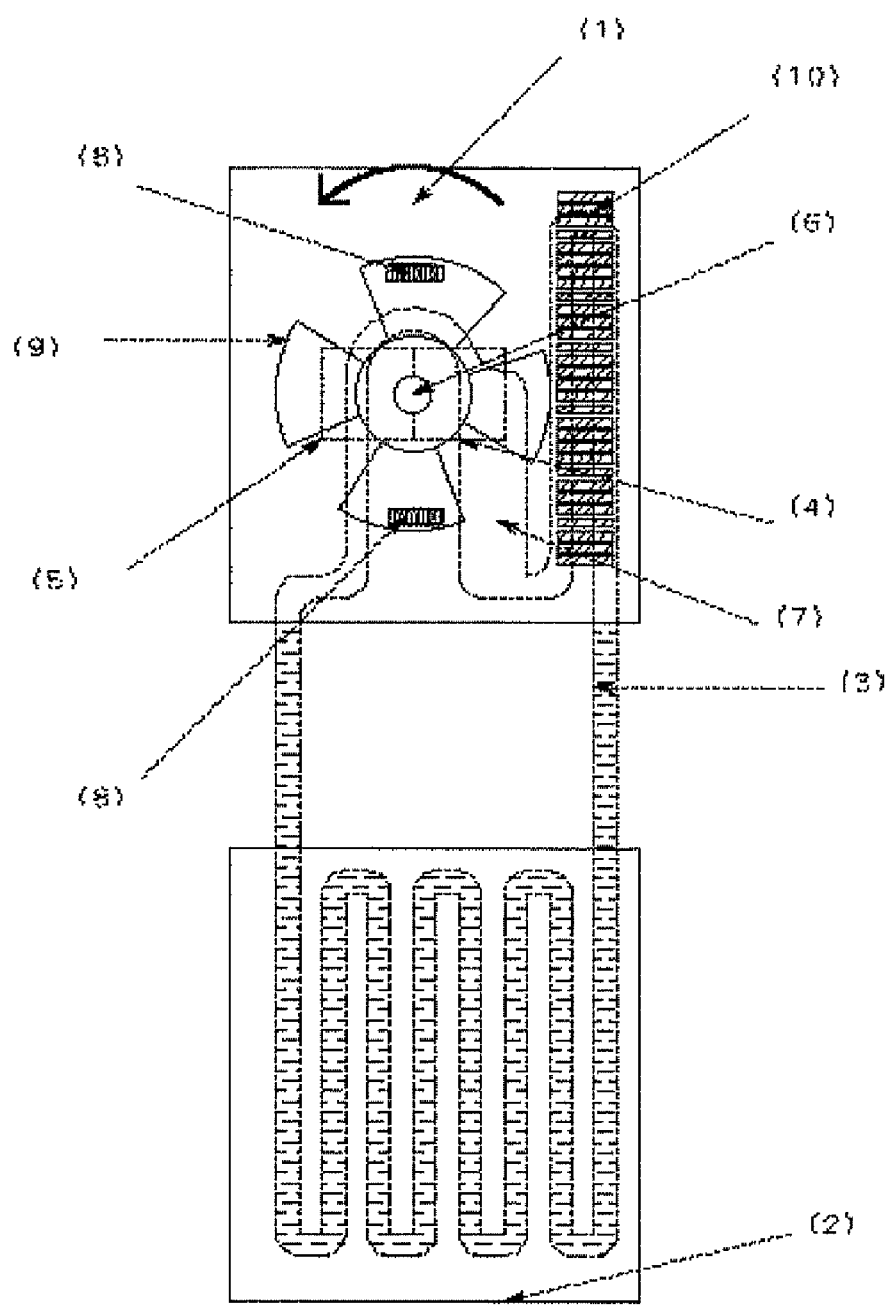
FIG. 4 is a schematic plan view of the fourth embodiment of the heat transfer apparatus according to the present invention.

Referring to FIG. 4, the fourth embodiment of the apparatus of the present invention is shown. The apparatus of this embodiment additionally comprises a fan (9) and a heat radiator (10) associated with the fluid flow path (3) within the heat discharging section (1). The fan (9) is mounted on the shaft (6) coaxially with the rotatable magnet unit (4, 5). In this embodiment, the magnet unit (4, 5) and the fan (9) are mounted on the same shalf (6) to rotate synchronously. A plurality of electromagnet elements (8) are distributed on the fan blades as shown and a controller (not shown) sequentially activates a series of electromagnet elements (8) to rotate the fan (8) and the magnet element (4, 5) in the manner as is well known in the art.

In addition to the fan (9), a heat radiator (10) is provided in the heat discharging section (1) for discharging heat via radiation. The fun (9) functions to cool the fluid flow path (3) and thus the magnetic fluid therein in the vicinity of the rotating magnet unit (4, 5). It will be appreciated, however, that other blowing means may be used as well.

According to the present invention, an apparatus having heat transfer and discharge means may be provided with very simple and compact design for use, for example, as cooling means of computer CPU and other devices. In addition, the apparatus may be installed in a wide variety of locations by connecting between the heat receiving section (1) and the heat discharging section (2) by a flexible tubular member.

INDUSTRIAL APPLICABILITY

The heat transfer apparatus of the present invention may find use in the recovery of waste heat generated in electric power plants or energy conversion plants of another type in environment-friendly manner. Other usages which can be envisaged include a heat transfer element utilizing earth heat, a heat equalizer of satellite panels, cooling means for electronic devices and the like.

The invention claimed is:

1. A heat transfer apparatus of a forced convection type comprising a heat receiving section, a heat discharging section, a fluid flow path for circulating a magnetic fluid between said heat receiving and said heat discharging sections, and a rotatable magnet unit disposed alongside at least a portion of said fluid flow path in said heat discharging section, wherein said rotatable magnet unit applies a varying magnetic force to said magnetic fluid in said portion of the fluid flow path in said heat discharging section, wherein said fluid flow path in said heat discharging section has different inner volumes between the upstream side and the downstream side of the rotating area of said magnet unit, the inner volume of said fluid flow path on said upstream side being greater than the inner volume of said fluid flow path on said downstream side.

2. The heat transfer apparatus according to claim 1, wherein said fluid flow path is formed in a closed loop by connecting both ends of said fluid path in said heat receiving section to respective ends of said fluid path in said heat discharging section with respective connecting conduits.

3. The heat transfer apparatus according to claim 2, wherein at least one of said connecting conduit carries a first magnet of the first polarity for attaching the conduit to the fluid flow path in said heat receiving section carrying a second magnet of the second polarity.

4. The heat transfer apparatus according to claim 1, wherein said rotatable magnet unit is coaxially connected to air blowing means which is rotated synchronously or non-synchronously with the magnet unit.

5. The heat transfer apparatus according to claim 4, wherein said air blowing means is rotated by activating a plurality of electromagnets associated therewith.

* * * * *